United States Patent
Wu et al.

(10) Patent No.: US 7,519,120 B2
(45) Date of Patent: Apr. 14, 2009

(54) CLOCK EMI REDUCTION

(75) Inventors: Sheng Wu, Elmsford, NY (US); Noah Gottfried, Johnsonburg, NJ (US); James Burnell, Warwick, NY (US); Corey M. Dayton, Newburgh, NY (US)

(73) Assignee: Fujitsu Limited, Kawasaki (JP)

( * ) Notice: Subject to any disclaimer, the term of this patent is extended or adjusted under 35 U.S.C. 154(b) by 631 days.

(21) Appl. No.: 11/253,646

(22) Filed: Oct. 20, 2005

(65) Prior Publication Data

US 2007/0103883 A1    May 10, 2007

(51) Int. Cl.
*H04L 27/00* (2006.01)
*H05K 9/00* (2006.01)

(52) U.S. Cl. .......... 375/256; 361/818

(58) Field of Classification Search .......... 375/256, 375/257, 259, 226; 361/756, 801, 332.1
See application file for complete search history.

(56) References Cited

U.S. PATENT DOCUMENTS

| | | | | |
|---|---|---|---|---|
| 6,064,948 | A * | 5/2000 | West et al. | 702/119 |
| 6,269,414 | B1 * | 7/2001 | Engdahl | 710/300 |
| 7,342,969 | B2 * | 3/2008 | Tate et al. | 375/257 |

\* cited by examiner

*Primary Examiner*—Khai Tran
(74) *Attorney, Agent, or Firm*—Hanify & King, P.C.

(57) ABSTRACT

EMI emissions generated by clock signals in a multi-slot electronic system are reduced by providing out-of-phase clock signals to alternate slots, which cause EMI emissions at typical testing distances and farther to be reduced. An electronic equipment comprises a plurality of slots, each slot operable to receive a clock signal and a plurality of phases of the clock signal, wherein a first phase of the clock signal is routed to a portion of the slots and a second phase of the clock signal is routed to a different portion of the slots. The second phase of the clock signal may be substantially 180° out-of-phase with the first phase of the clock signal.

8 Claims, 5 Drawing Sheets

CLOCK EMI REDUCTION

BACKGROUND OF THE INVENTION

1. Field of the Invention

The present invention relates to a method and system for reducing ElectroMagnetic Interference (EMI) emissions from system clock signals or other signals.

2. Description of the Related Art

ElectroMagnetic Interference (EMI) is electromagnetic radiation which is emitted by electrical circuits carrying rapidly changing signals, as a by-product of their normal operation, and which causes unwanted signals (interference or noise) to be induced in other circuits. This interrupts, obstructs, or otherwise degrades or limits the effective performance of those other circuits. Typically, EMI is induced unintentionally, as a result of spurious emissions and responses, intermodulation products, and the like.

EMI may affect AM or FM radio reception and television reception. As a result, many countries regulate the levels of EMI emissions that are allowed to emanate from electronic equipment and require testing of such equipment to verify compliance with the regulations. For example, a typical setup for performing EMI testing is shown in FIG. 1. Equipment under test 102 may be connected to test control equipment 104, which controls the operation of equipment 102 for purposes of the test, and to test equipment 106, which may be need to be connected to equipment 102 in order to allow equipment 102 to operate normally for the test. EMI emissions 108 emanate from equipment under test 102 and are received by antenna 110. EMI tester 112 is connected to antenna 110 and provides measurements of the levels of EMI emissions 108 as received by antenna 110.

In order to comply with EMI regulations, many techniques for reducing EMI have been developed. Examples of conventional EMI reduction techniques include the use of bypass or "decoupling" capacitors on each active device (connected across the power supply, as close to the device as possible), filtered connectors (feed-through capacitors), shielded cables, risetime control of high speed signals using series resistors, spread spectrum oscillators, and VCC filtering. Shielding is usually a last resort after other techniques have failed because of the added expense of RF gaskets and the like. However, all of these techniques increase the cost of the electronic equipment involved, as additional electronic and mechanical components must be added to otherwise fully functional equipment. A need arises for a reduced-cost technique by which EMI emissions may be reduced.

SUMMARY OF THE INVENTION

The present invention reduces EMI emissions generated by clock signals in a multi-slot electronic system by providing out-of-phase clock signals to alternate slots, which cause EMI emissions at typical testing distances and farther to be reduced. This scheme may be implemented at low cost. If a multi-slot electronic system has clock driver circuitry for each slot, the scheme may be implemented at no cost.

In one embodiment of the present invention, an electronic equipment comprises a plurality of slots, each slot operable to receive a clock signal and a plurality of phases of the clock signal, wherein a first phase of the clock signal is routed to a portion of the slots and a second phase of the clock signal is routed to a different portion of the slots. The second phase of the clock signal may be substantially 180° out-of-phase with the first phase of the clock signal.

In one aspect of the present invention, the electronic equipment may further comprise a clock generator operable to generate the first phase of the clock signal and the second phase of the clock signal and further operable to enable or disable a clock signal to each slot based on a presence or absence of a device in each slot. The clock generator may be further operable to automatically attempt to equalize a number of slots receiving the first phase of the clock signal and a number of slots receiving the second phase of the clock signal. The phases of the clock signal may be routed on signal conductors that are adjacent to each other.

In one aspect of the present invention, the plurality of phases of the clock signal may comprise at least four phases. The phases of the clock signal may be routed on signal conductors that are adjacent to each other.

In one embodiment of the present invention, an electronic equipment comprises a backplane having a plurality of slots, the backplane having a plurality of conductors, each conductor operable to connect a clock signal to a slot and a clock generator connected to the conductors and operable to generate a plurality of phases of the clock signal, wherein a first phase of the clock signal is transmitted over a first conductor to a first slot and a second phase of the clock signal is transmitted over a second conductor to a second slot. The second phase of the clock signal may be substantially 180° out-of-phase with the first phase of the clock signal.

In one aspect of the present invention, the clock generator may be further operable to enable or disable a clock signal to each slot based on a presence or absence of a device in each slot. The clock generator may be further operable to automatically attempt to equalize a number of slots receiving the first phase of the clock signal and a number of slots receiving the second phase of the clock signal. The phases of the clock signal may be routed on signal conductors that are adjacent to each other.

In one aspect of the present invention, the plurality of phases of the clock signal may comprise at least four phases. The phases of the clock signal may be routed on signal conductors that are adjacent to each other.

BRIEF DESCRIPTION OF THE DRAWINGS

The preferred embodiments of the present invention will be described with reference to the accompanying drawings.

DETAILED DESCRIPTION OF THE PREFERRED EMBODIMENTS

The present invention reduces EMI emissions generated by clock signals in a multi-slot electronic system by providing out-of-phase clock signals to alternate slots, which cause EMI emissions at typical testing distances and farther to be reduced. This scheme may be implemented at low cost. If a multi-slot electronic system has clock driver circuitry for each slot, the scheme may be implemented at no cost.

Figure 1:
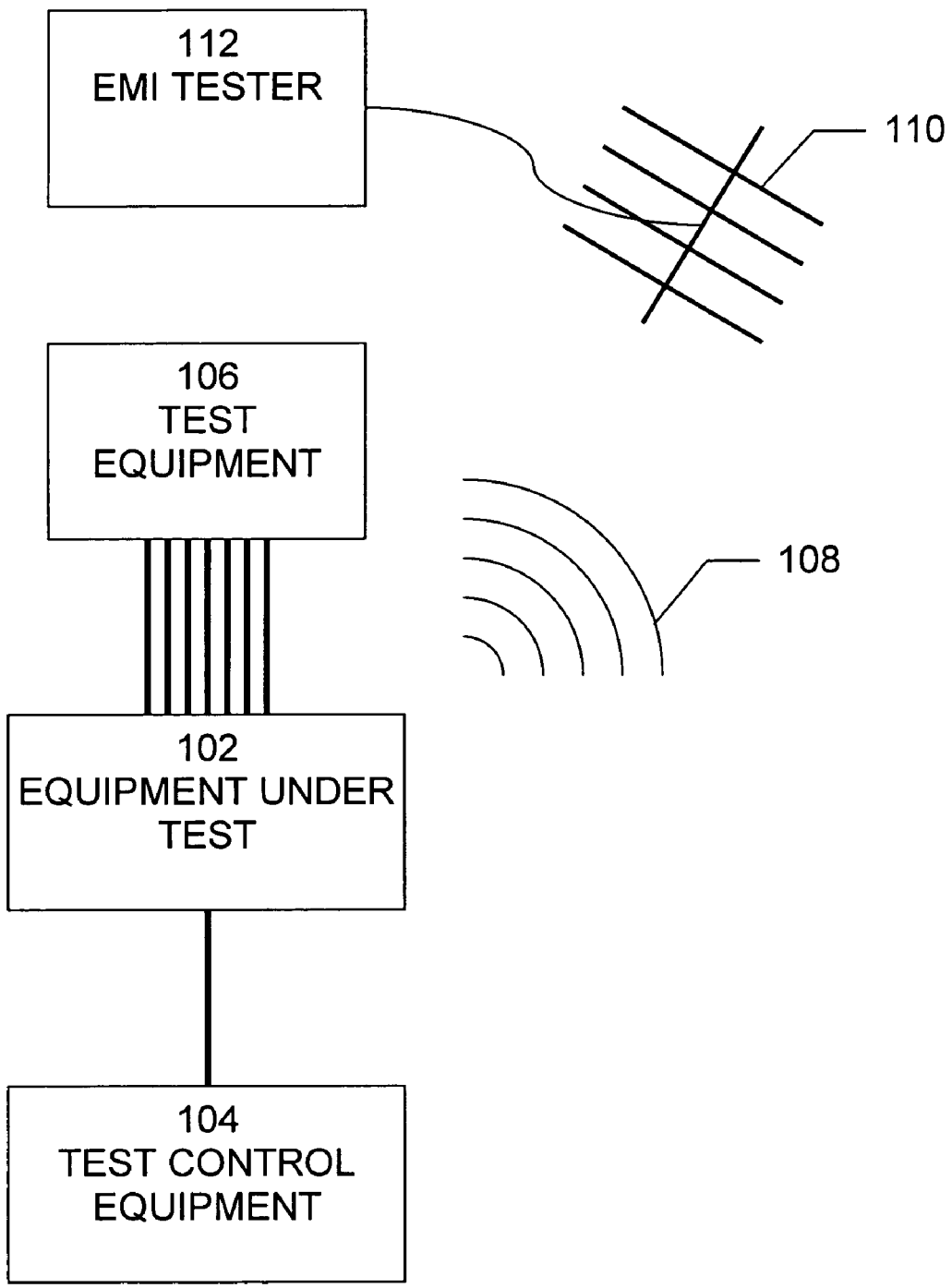
FIG. 1 is an exemplary block diagram of a prior art setup for performing EMI testing.
Figure 2:
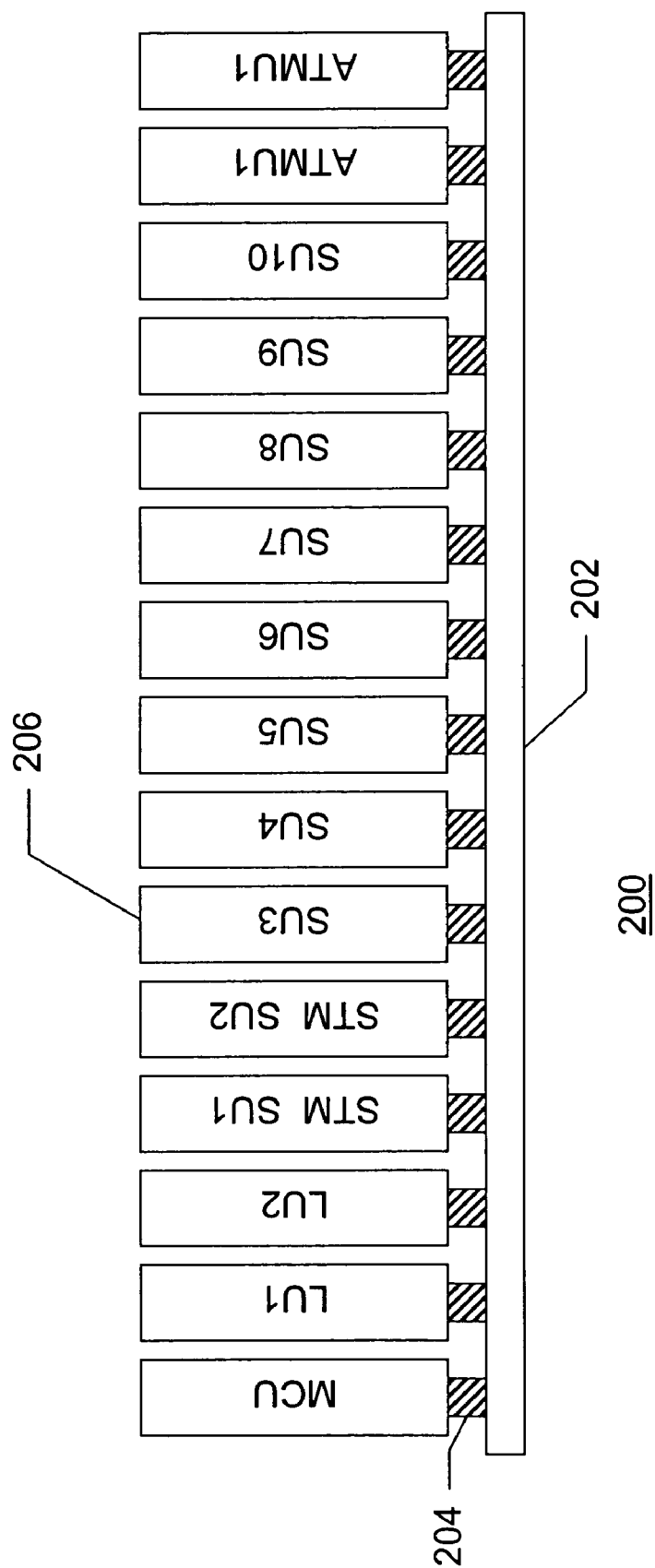
FIG. 2 is an exemplary block diagram of electronic equipment, in which the present invention may be implemented.

An example of electronic equipment 200, in which the present invention may be implemented, is shown in FIG. 2. Equipment 200 includes a backplane 202, which is typically is a circuit board, such as a printed circuit board, that connects several connectors or slots 204. The pins of slots 204 may be connected in parallel to each other, so that each pin of each connector is linked to the same relative pin of all the other connectors, forming a bus, or the pins of slots 204 may be connected in different configurations. Boards or modules 206 plug-in to the slots 204 and backplane 202 provides connectivity among the boards or modules 206. Backplanes are normally used in preference to cables because of their greater reliability.

There are many types of systems that use backplanes, such as computer systems, telecommunications systems, etc. In the example shown in FIG. 2, a telecommunications platform may include a variety of modules 206 plugged-in the slots 204 of the backplane 202. For example, modules in such a platform may include a master control unit (MCU), which may generate a clock signal, line units (LUs), which provide communication with electrical communications networks, such as Ethernet, etc., service units (SUs), which provide communication with optical communications networks, and asynchronous transfer mode units (ATMUs), which provide communications with ATM networks.

One type of signal that is commonly provided to all slots 204 or backplane 202 is a clock signal. A clock signal is a signal used to coordinate the actions of two or more circuits, such as the boards or modules 206. The circuits using the clock signal for synchronization may become active at either the rising or falling edge, or both (see for example DDR SDRAM), of the clock signal. As the clock signal is typically provided to all slots in a backplane, the circuit wiring involved typically extends the length of the backplane, and is capable of relatively high drive currents. As a result, clock signals are of particular concern for EMI emissions.

Figure 3:
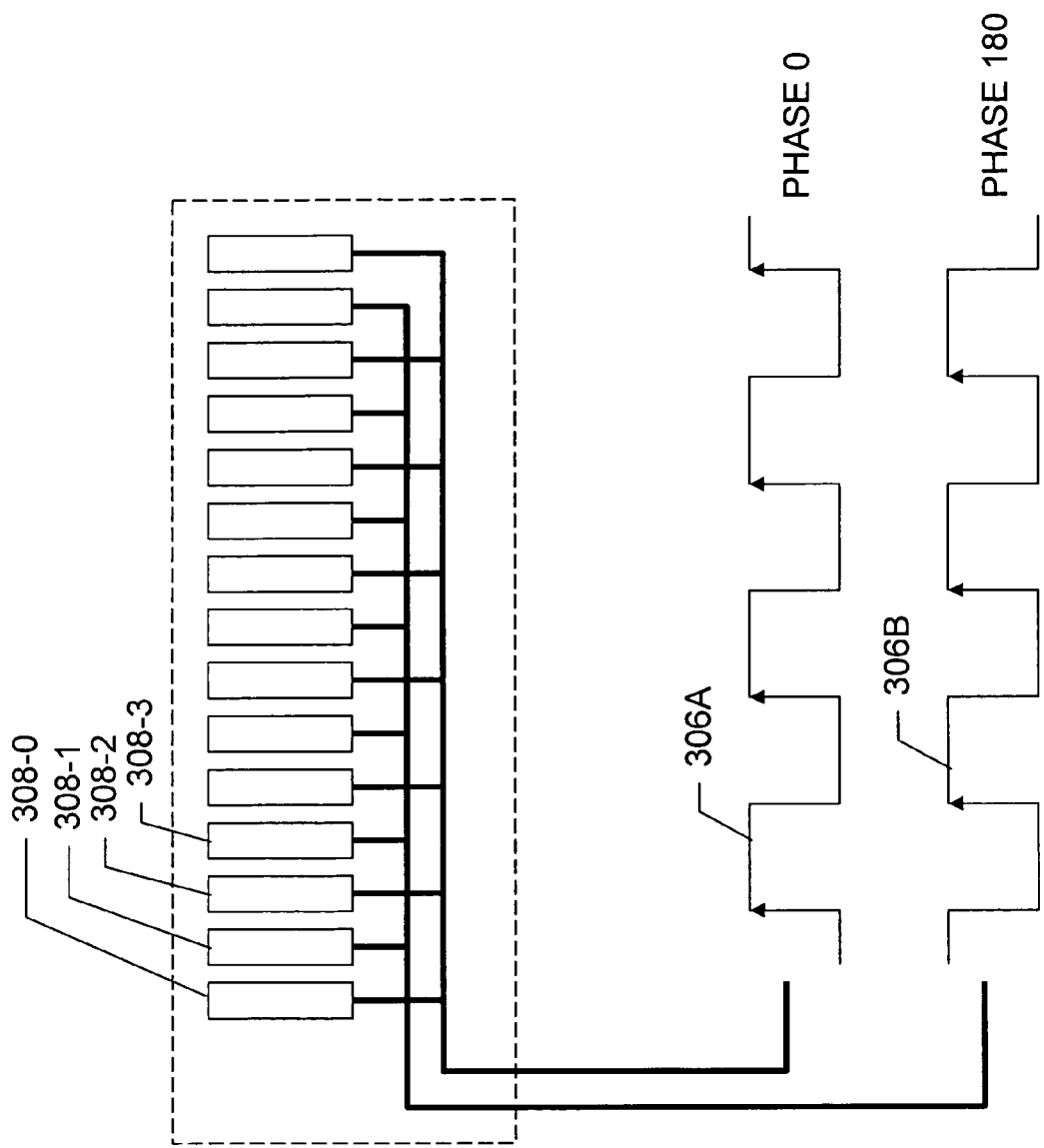
FIG. 3 is an exemplary block diagram of a backplane system incorporating the present invention.

An example of a backplane system 300 incorporating the present invention is shown in FIG. 3. System 300 includes a backplane 302 having a plurality of slots 304. Signals 306A and 306B are applied to alternate slots of backplane 302. For example, signal 306A is applied to the even slots, such as slots 308-0 and 308-2, etc., while signal 306B is applied to the odd slots, such as slots 308-1 and 308-3, etc. As shown, signals 306A and 306B are substantially 180° out of phase with each other.

This technique is particularly applicable to electronic equipment where the wavelength of the signal, for which EMI emissions are to be reduced, is greater than or equal to about 10 times the largest dimension of the electronic equipment. In this situation, the equipment may be considered as a point source relative to the wavelength of the signal. For example, if a signal of concern for EMI emissions has a frequency of 25 MHz (wavelength~13 m) and the electronic equipment has a chassis size of about 0.7 m, the electromagnetic waves emitted from two different slots of the equipment (an odd slot and an even slot) into open space to the EMI reception antennas may be treated as emissions of two signals from a single point, but with the two signals having opposite phases. Thus, the two signals having opposite phases and emitted from a single point will tend to cancel each other at distances on the order of a wavelength of the signal.

Figure 4:
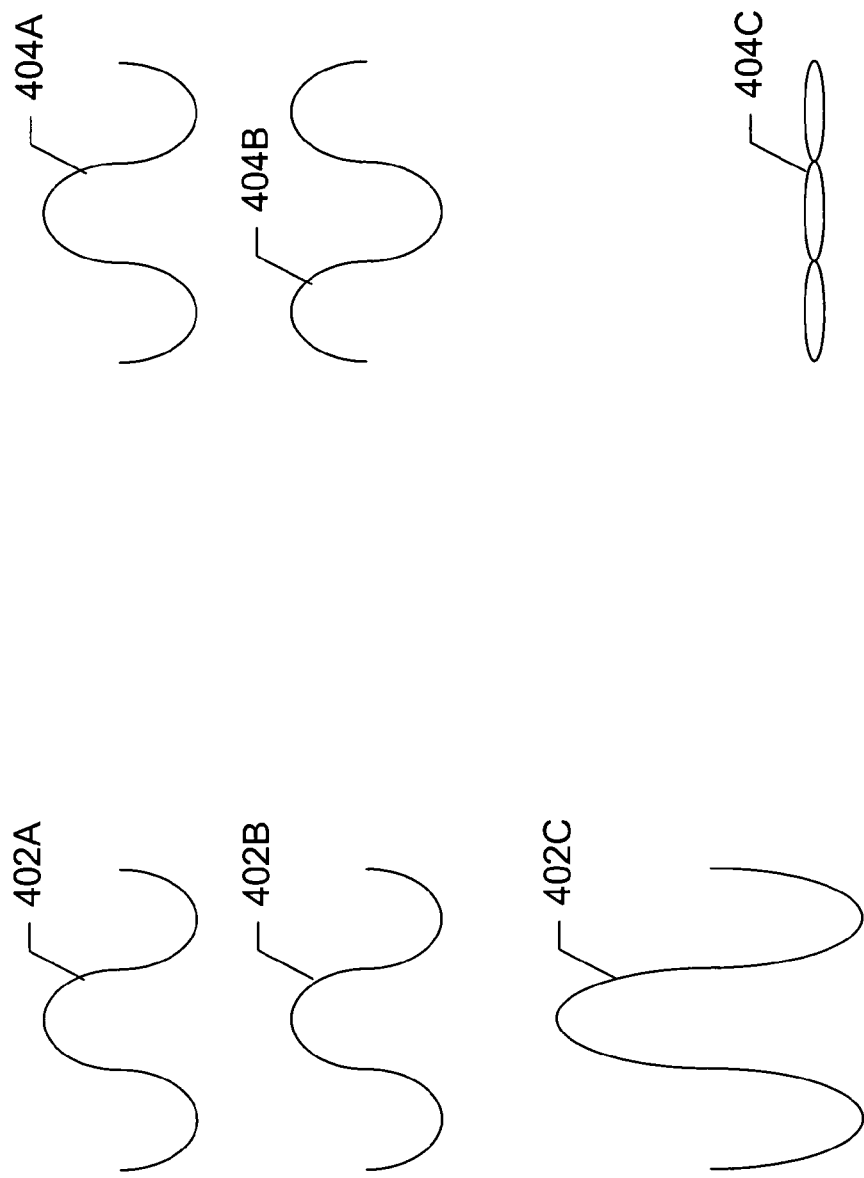
FIG. 4 illustrates exemplary waveforms of in-phase and out-of-phase signals.

As shown in FIG. 4, signals 306A and 306B being substantially 180° out of phase with each other results in a reduction of EMI emissions. For example, waveforms 402A and 402B represent EMI emissions from a plurality of in-phase signals. These in-phase emissions tend to reinforce each other, so that at distances on the order of a wavelength of the emissions, the combined amplitude 402C of the emissions is substantially increased from the amplitude of any single emission. By contrast, waveforms 404A and 404B represent EMI emissions from a plurality of out-of-phase signals. These out-of-phase emissions tend to cancel each other, so that at distances on the order of a wavelength of the emissions, the combined amplitude 404C of the emissions is substantially reduced from the amplitude of any single emission.

Figure 5:
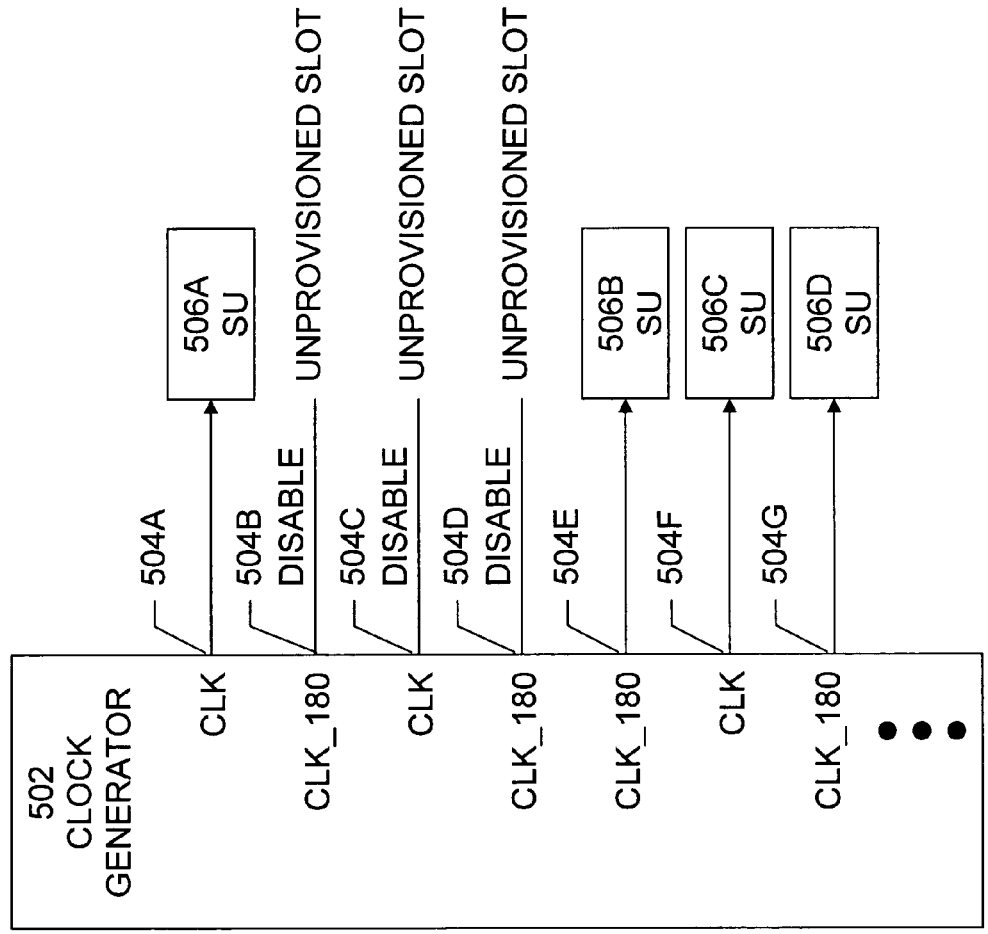
FIG. 5 is an exemplary block diagram of a clock generator, which may be used to generate out-of-phase clock signals in accordance with the present invention.

An example of a clock generator 502, which may be used to generate out-of-phase clock signals in accordance with the present invention, is shown in FIG. 5. Clock generator 502 includes a plurality of outputs 504A-G. Each output 504A-G is connected to a slot, which may or may not contain a device, such as a service unit (SU) 506A-D or other circuit board or module. For unprovisioned slots, that is, slots that do not contain a device, clock generator 502 may dynamically detect the absence of a device and disable the output. For example, the slots connected to outputs 504B, 504C, and 504D are unprovisioned, so clock generator 502 automatically disables the outputs 504B, 504C, and 504D. Likewise, clock generator 502 may dynamically detect the presence of devices in the provisioned slots and automatically enable the outputs. For example, the slots connected to outputs 504A, 504E, 504F, and 504G contain service units 506A, 506B, 506C, and 506D, respectively, so clock generator 502 automatically enables the outputs 504A, 504E, 504F, and 504G. Further, clock generator 502 may automatically balance or attempt to equalize the number of slots receiving the 0° phase clock (CLK) and the number of slots receiving the 180° phase clock (CLK_180). This automatic balancing provides automatic reduction in the EMI emissions caused by the clock signals. It is to be noted that even if clock generator 502 does not automatically enable and balance clock outputs, it may be possible to easily manually configure the clock outputs in order to reduce the EMI emissions caused by the clock signals.

Although specific embodiments of the present invention have been described, it will be understood by those of skill in the art that there are other embodiments that are equivalent to the described embodiments. For example, in some electronic equipment it may be advantageous to reducing EMI emissions to provide more than two phases of clock, such as four or more phases, or even a different phase for each active clock signal. In some equipment, the provision of multiple phases of signals may be advantageously applied to signals other than clock signals. Likewise, in some equipment, it may be advantageous to route out-of-phase signal conductors next to or adjacent to each other. In addition, the technique may be applied to a wide variety of electronic equipment, such as single boards, a shelf with multiple plug-ins, multiple connected shelves, etc.

Accordingly, it is to be understood that the invention is not to be limited by the specific illustrated embodiments, but only by the scope of the appended claims.

What is claimed is:

1. An electronic equipment comprising:
   a plurality of slots, each slot operable to receive a clock signal;
   a plurality of phases of the clock signal, wherein a first phase of the clock signal is routed to a portion of the slots and a second phase of the clock signal is routed to a different portion of the slots; and
   a clock generator operable to generate the first phase of the clock signal and the second phase of the clock signal and further operable to enable or disable a clock signal to each slot based on a presence or absence of a device in each slot, wherein the second phase of the clock signal is substantially 180° out-of-phase with the first phase of the clock signal.

2. The electronic equipment of claim 1, wherein the clock generator is further operable to automatically attempt to equalize a number of slots receiving the first phase of the clock signal and a number of slots receiving the second phase of the clock signal.

3. The electronic equipment of claim 2, wherein the phases of the clock signal are routed on signal conductors that are adjacent to each other.

4. The electronic equipment of claim 1, wherein the plurality of phases of the clock signal comprises at least four phases.

5. An electronic equipment comprising:
a backplane having a plurality of slots, the backplane having a plurality of conductors, each conductor operable to connect a clock signal to a slot; and
a clock generator connected to the conductors, the clock generator operable to generate a plurality of phases of the clock signal, and operable to enable or disable a clock signal to each slot based on a presence or absence of a device in each slot, wherein a first phase of the clock signal is transmitted over a first conductor to a first slot and a second phase of the clock signal is transmitted over a second conductor to a second slot, and
wherein the second phase of the clock signal is substantially 180° out-of-phase with the first phase of the clock signal.

6. The electronic equipment of claim 5, wherein the clock generator is further operable to automatically attempt to equalize a number of slots receiving the first phase of the clock signal and a number of slots receiving the second phase of the clock signal.

7. The electronic equipment of claim 6, wherein the phases of the clock signal are routed on signal conductors that are adjacent to each other.

8. The electronic equipment of claim 5, wherein the plurality of phases of the clock signal comprises at least four phases.

* * * * *